(12) United States Patent
Malik et al.

(10) Patent No.: US 6,294,423 B1
(45) Date of Patent: Sep. 25, 2001

(54) METHOD FOR FORMING AND FILLING ISOLATION TRENCHES

(75) Inventors: Rajeev Malik, Pleasantville; Mihel Seitz, Wappingers Falls; Andreas Knorr, Fishkill, all of NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/718,211

(22) Filed: Nov. 21, 2000

(51) Int. Cl.$^7$ .................................................. H01L 21/8242
(52) U.S. Cl. ............................ 438/241; 438/258; 438/427
(58) Field of Search .................................... 438/241, 258, 438/427

(56) References Cited

U.S. PATENT DOCUMENTS

| | | | |
|---|---|---|---|
| 4,495,025 | * 1/1985 | Haskell | 438/427 |
| 5,384,280 | * 1/1995 | Aoki et al. | 438/425 |
| 5,536,675 | * 7/1996 | Bohr | 438/427 |
| 5,731,221 | * 3/1998 | Kwon | 438/426 |
| 5,804,490 | 9/1998 | Fiegl et al. | |
| 5,851,899 | 12/1998 | Weigand | |
| 5,895,253 | * 4/1999 | Akram | 438/424 |
| 5,950,093 | * 9/1999 | Wei | 438/401 |
| 5,981,357 | * 11/1999 | Hause et al. | 438/427 |
| 6,133,083 | * 10/2000 | Lin et al. | 438/238 |

* cited by examiner

Primary Examiner—Richard Booth
Assistant Examiner—Jennifer M. Kennedy
(74) Attorney, Agent, or Firm—Stanton C. Braden

(57) ABSTRACT

A method for forming isolation trenches for a semiconductor device forms, in a substrate, a plurality of trenches having different widths including widths above a threshold size and widths below a threshold size. The plurality of trenches have a same first depth. A masking layer is deposited in the plurality of trenches, the masking layer has a thickness sufficient to both line the trenches with the widths above the threshold size and completely fill the trenches with the widths below the threshold size. A portion of the substrate is exposed at a bottom of the trenches with the widths above the threshold size by etching the masking layer. The plurality of trenches is etched to extend the trenches with the widths above the threshold size to different depths.

22 Claims, 10 Drawing Sheets

METHOD FOR FORMING AND FILLING ISOLATION TRENCHES

BACKGROUND

1. Technical Field

This disclosure relates to semiconductor fabrication, and more particularly, to a method for forming and filling trenches of different sizes in a single process.

2. Description of the Related Art

Shallow trench isolations (STI) structures are provided in semiconductor chips to isolate integrated semiconductor devices, such as, transistors. STI structures are formed in trenches etched from a silicon substrate or other materials adjacent to an active area of a semiconductor chip layout. These trenches are typically etched down to a depth of about 250 nm to 300 nm. These trenches are usually lined with a nitride liner and/or a thermally grown oxide liner and filled with an oxide material to provide isolation between semiconductor devices.

In certain situations, STI regions are required at greater depths. In these cases, aggressive filling of the trenches may cause voids or an incomplete fill. This can have consequences on chip yield and on device reliability. Therefore, very restrictive gapfill requirements are needed in order to ensure a complete fill. Further, since all trenches may not be of a same depth or same opening width, different processes may be needed to fill the different trenches.

Therefore, a need exists for a method of defining a depth for trench isolation structures which maintains an aspect ratio of the trenches to permit a complete fill.

SUMMARY OF THE INVENTION

A method for forming isolation trenches forms, in a substrate, a plurality of trenches having different widths including widths above a threshold size and widths below a threshold size. The plurality of trenches have a same first depth.

A masking layer is deposited in the plurality of trenches, the masking layer has a thickness sufficient to both line the trenches with the widths above the threshold size and completely fill the trenches with the widths below the threshold size. A portion of the substrate is exposed at the bottom of the trenches with the widths above the threshold size by etching the masking layer. The plurality of trenches is etched to extend the trenches with the widths above the threshold size to a different depth.

Another method for forming isolation trenches in semiconductor devices, includes the steps of forming, in a substrate, first trenches having a first width and second trenches having a second width wherein the first width is larger than the second width and the first and second trenches have a same first depth, depositing a masking layer in the first and second trenches, the masking layer including a thickness sufficient to both line the first trenches and completely fill the second trenches, exposing a portion of the substrate at a bottom of the first trenches by etching the masking layer to form an opening through the masking layer at the first depth, and etching the first and second trenches to extend the first trenches to a second depth.

Yet another method for forming isolation trenches in semiconductor devices includes the steps of providing a semiconductor substrate having a memory array area and a support area formed thereon, forming, in the semiconductor substrate, first trenches having a first width in the memory array area and second trenches having a second width in the support area, wherein the first width is larger than the second width and the first and second trenches have a same first depth, depositing a masking layer in the first and second trenches, the masking layer including a thickness sufficient to both line the first trenches and completely fill the second trenches, exposing a portion of the substrate at a bottom of the first trenches by etching the masking layer to form an opening through the masking layer at the first depth, etching the first and second trenches to extend the first trenches to a second depth while maintaining an aspect ratio of the first trenches below a threshold value and filling the first trenches to the second depth and the second trenches to the first depth with a dielectric material in a single deposition step.

In other methods, the step of forming, in a substrate, a plurality of trenches may include the steps of forming the trenches with the widths above the threshold size in a memory array and forming the trenches with the widths below the threshold size in a support area. The step of depositing a masking layer may include the step of conformally depositing the masking layer with a low pressure chemical vapor deposition process. The masking layer may include TEOS. The method may include the step of maintaining an aspect ratio of the different depths below a value for the trenches with the widths above the threshold size. The method may include the step of filling the plurality of trenches in a single deposition step. The aspect ratio is preferably less than or equal to 5. The step of etching the plurality of trenches may include the step of anisotropically etching the trenches to increase the depth of the trenches with the widths above the threshold size. The step of etching the plurality of trenches may include the step of isotropically etching the trenches to increase the width of the trenches with the widths above the threshold size.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides methods for defining an isolation trench depth. Advantageously, the depth of the isolation trenches is formed in stages. The present invention is particularly useful in applications where trench isolation regions have a plurality of different spacings or groundrules across a chip. In one example, dynamic random access memories (DRAMs) or other memory devices may include trench isolation regions in a memory array with a first groundrule and also include trench isolation regions in a support area with a second groundrule. The present invention will be described herein, by way of example, with reference to a memory device. However the present invention is broader and may include processor chips, embedded memory chip (e.g., embedded DRAM), application specific integrated circuits or any other semiconductor chip.

The present invention etches isolation trenches to a first depth. Then, a masking layer is deposited in the trench which lines the sidewalls of the trenches. This masking layer is preferably conformally deposited and parameters are selected to fill smaller trenches which do not need to be deeper, while lining sidewalls of trenches with larger openings. This masking layer protects sidewalls of a substrate in which the trenches are formed. An additional etch process is employed to remove the masking layer from the bottoms of the trenches with larger openings and to deepen only the trenches with larger openings. This etching process is performed through an opening formed through the masking layer at the bottom of the first depth of the larger trenches.

The etching process deepens the larger trenches. In a preferred embodiment, the depth of the larger trenches is selected to maintain the trench aspect ratio across the entire chip. In this way, a single fill process can be employed which simultaneously fills all the trenches, in both the support region and the array region in the examples described herein.

Figure 1:
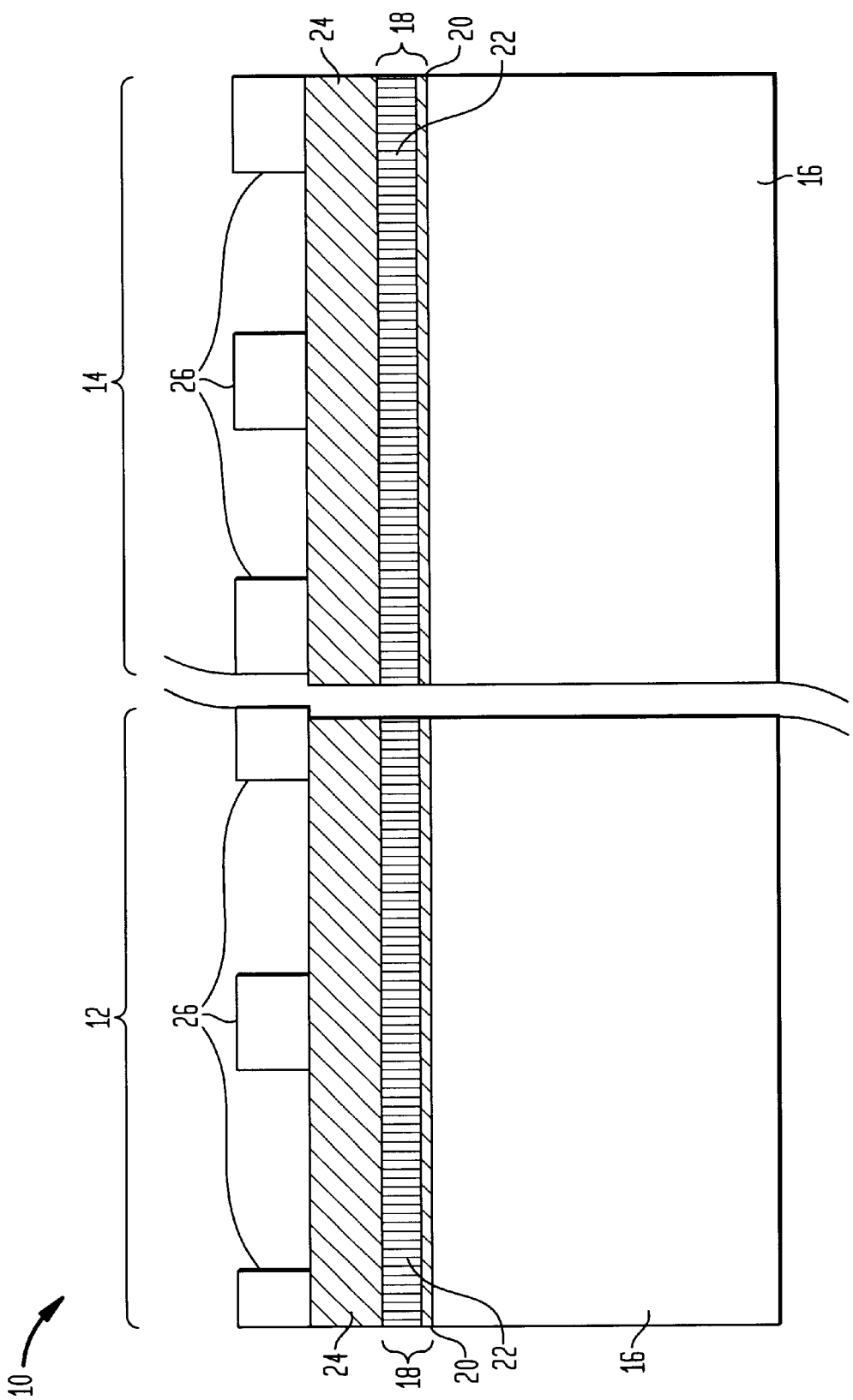
FIG. 1 is a cross-sectional view of a semiconductor device prior to isolation trench formation in accordance with the present invention.

Referring now in specific detail to the drawings in which like reference numerals identify similar or identical elements throughout the several views, and initially to FIG. 1, a partial cross-sectional view of a semiconductor device 10 is shown. In this illustrative embodiment, semiconductor device 10 includes a semiconductor memory, such as a DRAM. Device 10 includes an array region 12 and a support region 14 located in different areas of device 10. In FIG. 1, cross-sections of device were taken through regions where trench isolation structures will be etched. FIG. 1 shows these regions prior to etching. A pad dielectric layer 18 is formed over a surface of a substrate 16. Substrate 16 may include a monocrystalline silicon substrate, although any other suitable substrates may be employed, e.g., GaAs, etc. Pad dielectric layer 18 preferably includes a pad oxide layer 20 and a pad nitride layer 22. Other layers may also be employed in addition to or instead of layer 20 and 22.

A hardmask layer 24 is deposited on pad dielectric layer 18. Hard mask 24 may include an oxide material, such as a silicate glass, or preferably TEOS. Hard mask layer 24 is patterned by a known photolithography process, which preferably employs a resist layer 26, which is developed to form an etching mask for patterning hardmask layer 24.

Array region 12 includes memory array cells, which include access devices such as transistors and capacitors, such as deep trench capacitors, as is known in the art. Array region 12 may include vertically disposed transistor (vertical transistors) as access devices for deep trench capacitors. Vertical transistors may need trench isolations which extend deeper into a substrate than trench isolations needed in other areas of device 10, for example, in support region 14.

Support region 14 includes support circuitry employed for accessing array region 12 (e.g., for reading and writing data thereto). Support region 14 includes logic circuitry, multiplexers, amplifiers (e.g., sense amps), etc. as known in the art. In this example, trench isolation regions are needed to extend deeper into substrate 16 in array region 12 than in support region 14. This may be due to the use of vertical transistors in array region 12 or for other reasons.

Figure 2:
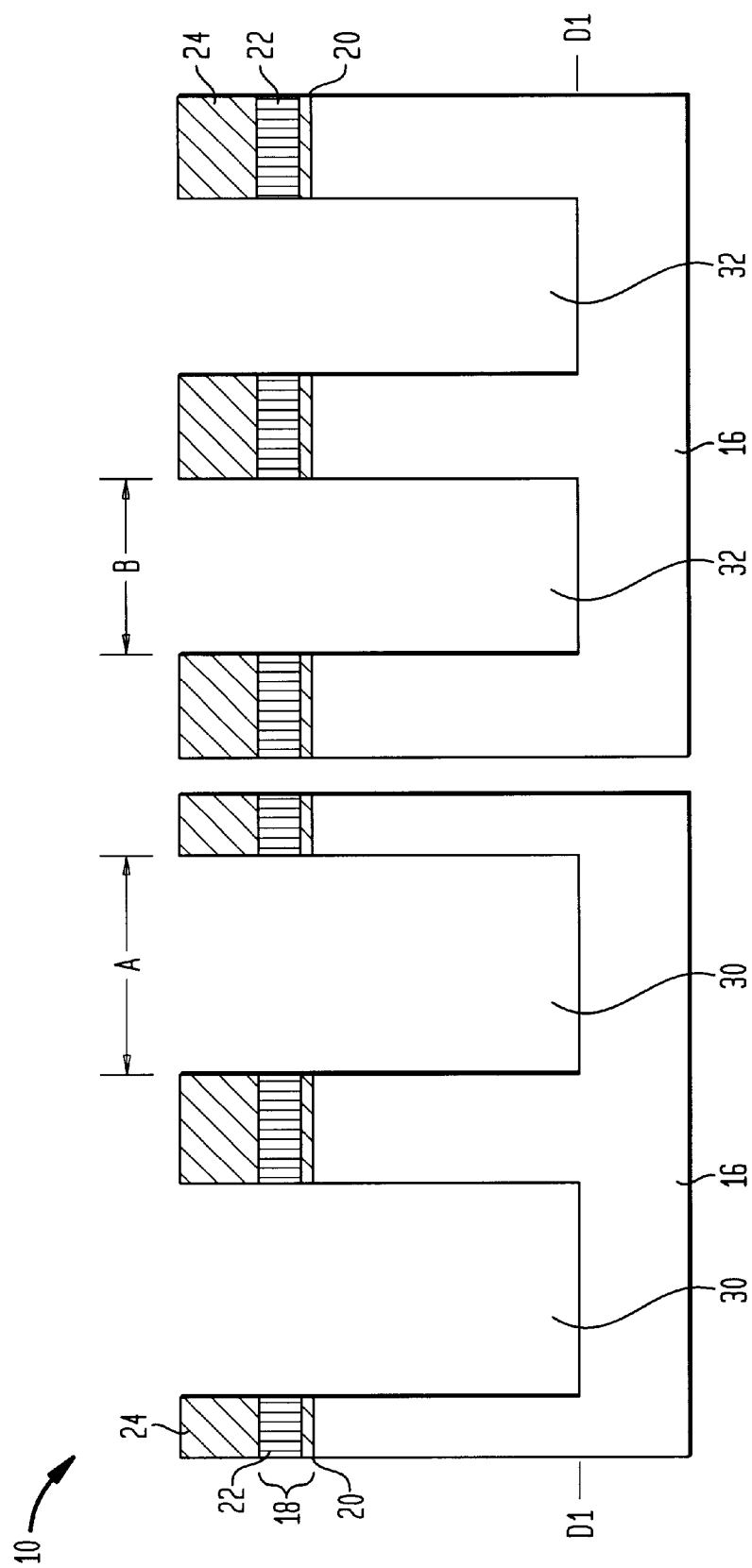
FIG. 2 is a cross-sectional view of the semiconductor device of FIG. 1 after isolation trenches are formed to a first depth and showing different spacing sizes for the trenches in accordance with the present invention.

Referring to FIG. 2, after patterning hard mask layer 24 by an etching process, resist layer 26 is removed. Hardmask layer 24 is then employed as an etching mask to etch through pad dielectric layer 18 and into substrate 16 to form trenches 30 and 32. In the embodiment shown in FIG. 2, widths or spacings, A and B, of trenches 30 and 32 are different. For example, A may be 2 times a groundrule or feature size dimension F, e.g., 2F, while B may be about 1.4F. The present invention exploits the difference in spacing size between trenches 30 and 32, as will be described in greater detail below.

Figure 3:
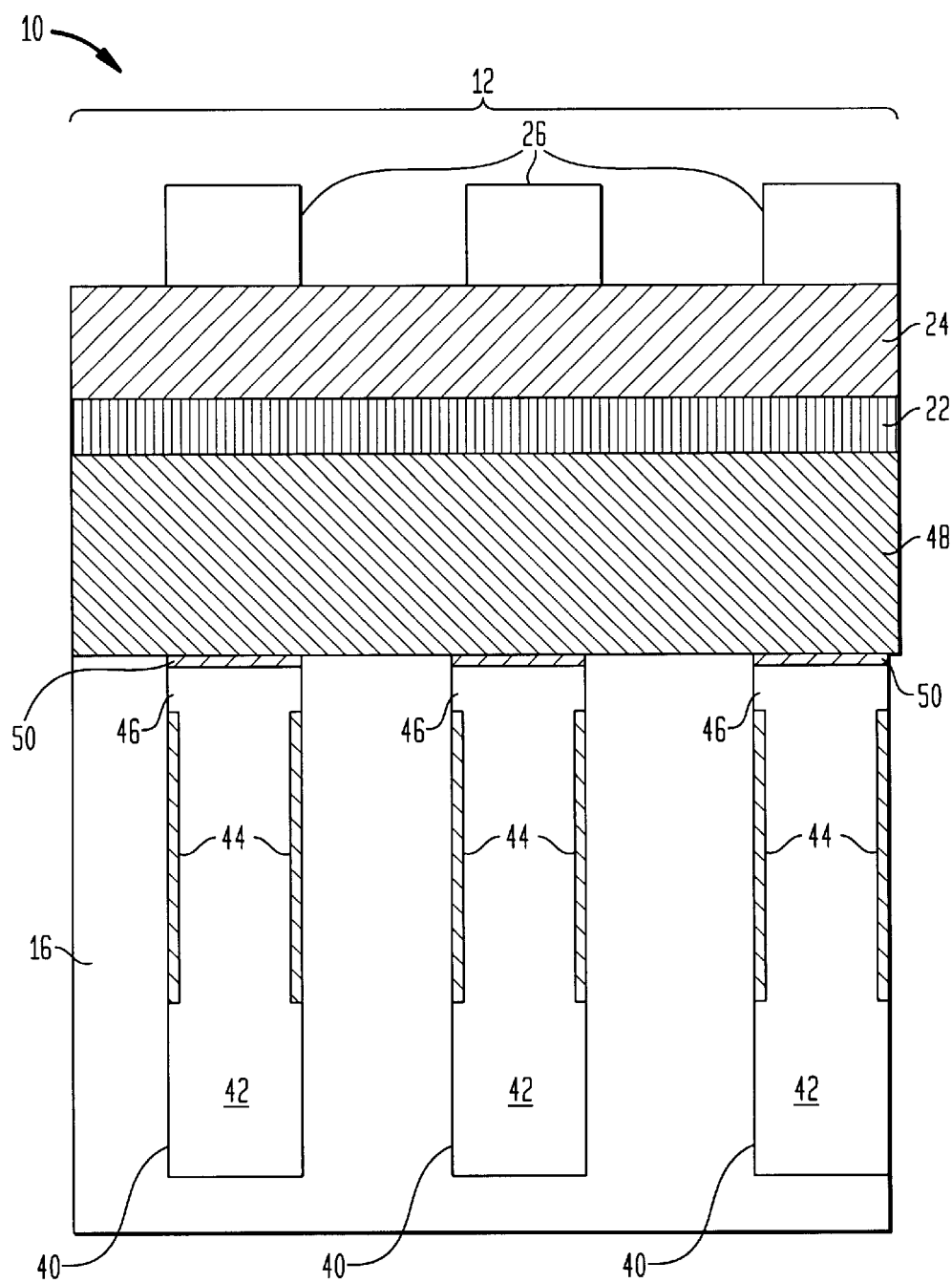
FIG. 3 is a cross-sectional view taken at a section through deep trench structures of a semiconductor device prior to isolation trench formation in accordance with the present invention.

Etching of trenches 30 and 32 may be performed by an anisotropic etching process, for example, reactive ion etching. Etching continues until a predetermined trench depth is reached, for example, between about 300 nm to about 500 nm, or some other criteria may be used. An example of other criteria may include etching until a particular layer or structure is reached in a different area of device 10. FIG. 3 is a cross-sectional view taken through a deep trench capacitor located in array portion 12.

Referring to FIG. 3, deep trenches 40 are formed and filled with a conductive material, such as doped polysilicon, to form storage nodes 42. An oxide collar 44 is formed in each trench 40. A buried strap 46 connects to polysilicon 48 of a gate structure through a portion (not shown) of substrate 16.

Figure 4:
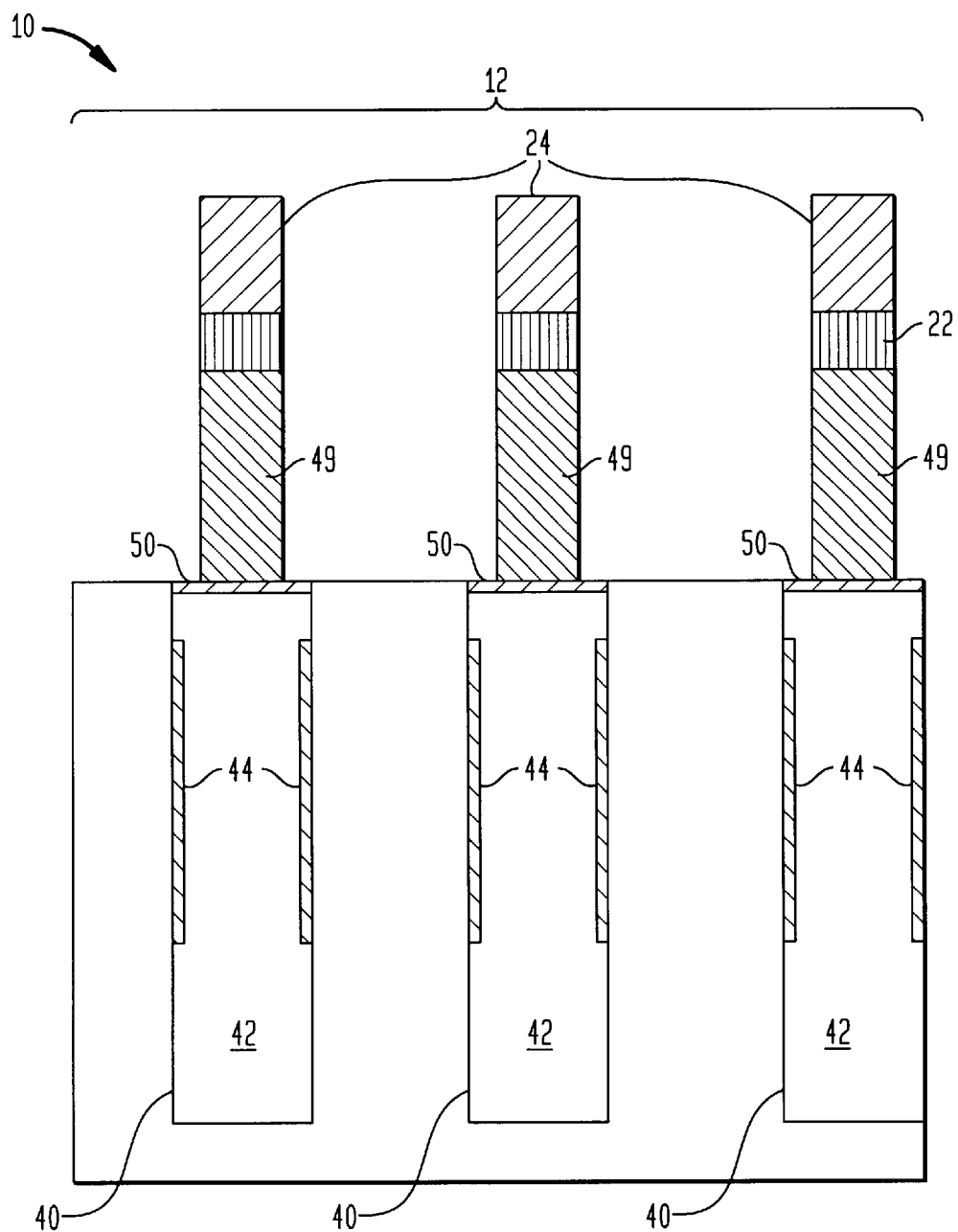
FIG. 4 is a cross-sectional view of the semiconductor device of FIG. 3 after simultaneous etching of polysilicon and isolation trenches in accordance with the present invention.

This will form the vertical access transistor for the memory cells of array portion 12. The etching process to form trenches 30 and 32 may also be employed to pattern polysilicon 48 of gate structures 49, as shown in FIG. 4. The depth of trenches may be determined when the etching reaches trench top oxide layer 50. In this way, the depth of trenches 30 and 32 is determined based on this criterion. Other criteria may also be employed. FIG. 4 shows the structure of FIG. 3 after etching.

Figure 5:
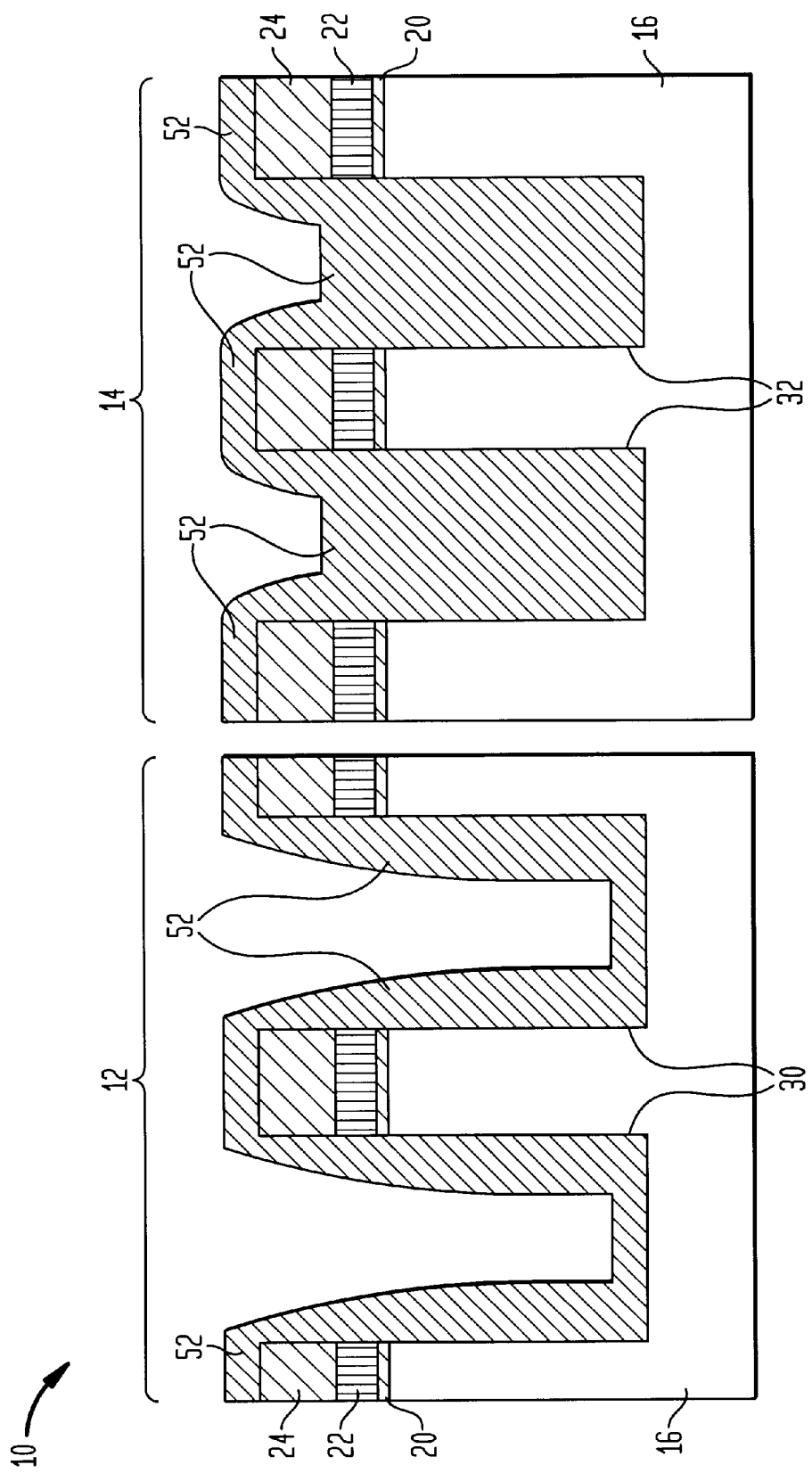
FIG. 5 is a cross-sectional view of the semiconductor device of FIG. 2 after the deposition of a masking layer in accordance with the present invention.

Referring to FIG. 5, a masking layer 52 deposition is performed. The deposition of masking layer 52 is preferably conformal. In addition, masking layer 52 preferable includes a material which can be employed an etch mask to etch substrate 16. In one embodiment, masking layer 52 includes a conformal TEOS deposited by a low pressure chemical vapor deposition. Masking layer 52 includes a thickness which is determined by deciding which trenches are to be deepened and which are not. In the example, trenches 32 are to be maintained at depth D1 (FIG. 2) while trenches 30 are to be made deeper in array portion 12. In the example, where spacing A is 2F and spacing B is 1.4F (see FIG. 2), a masking layer thickness of about 0.8F may be employed to fill trenches 32 in support area 14.

Figure 6:
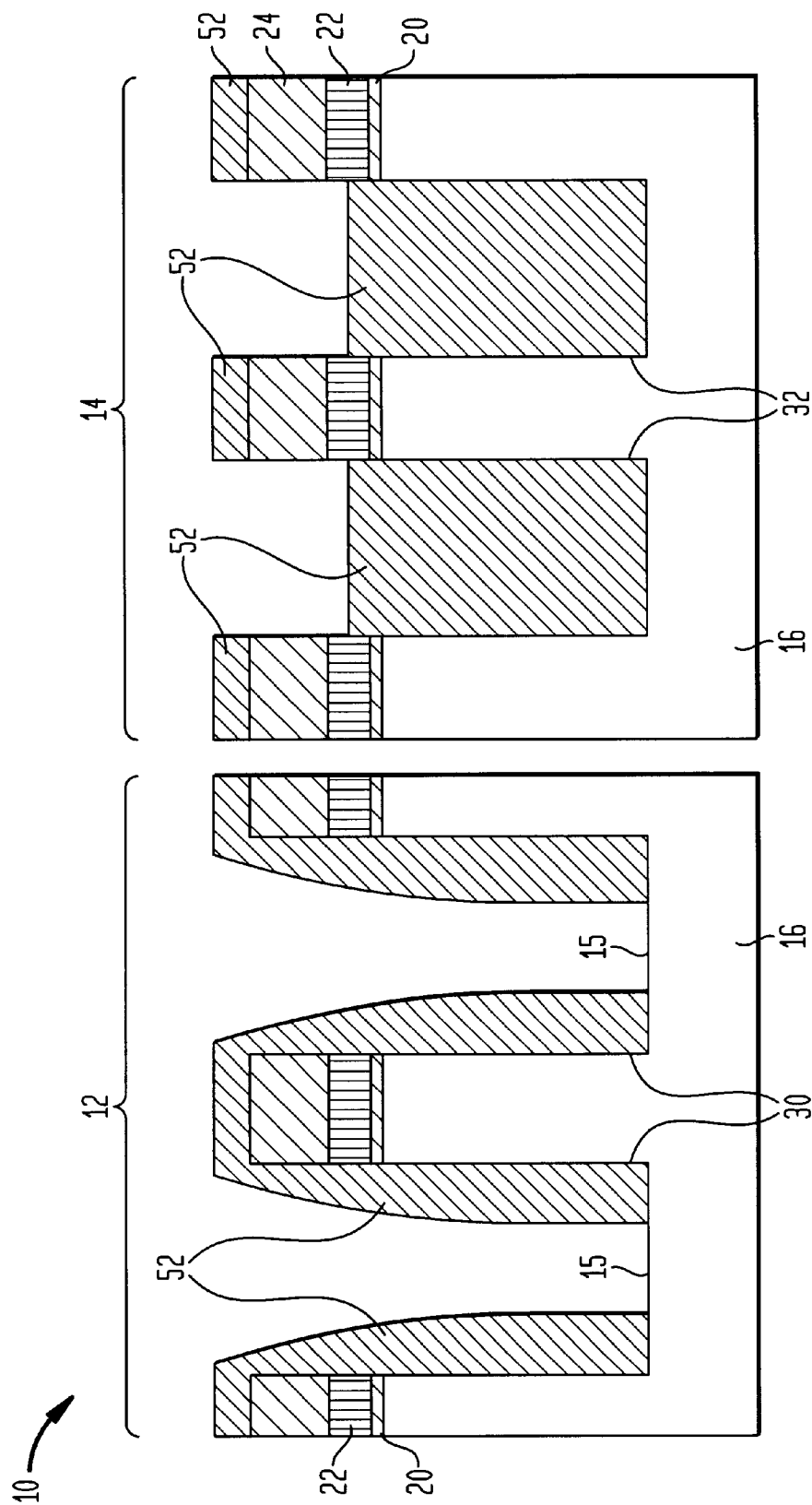
FIG. 6 is a cross-sectional view of the semiconductor device of FIG. 5 after a masking layer etching step in accordance with the present invention.

Referring to FIG. 6, an etch process is performed to etch away a portion of masking layer 52 from the bottom of trench 30. This etch process will recess masking layer 52 in support regions 14 a small amount. In array region 12, a portion 15 of substrate 16 is exposed at the bottom of trench 30 by the etching. The etching process preferably includes and anisotropic etch, such as reactive ion etching.

Figure 7:
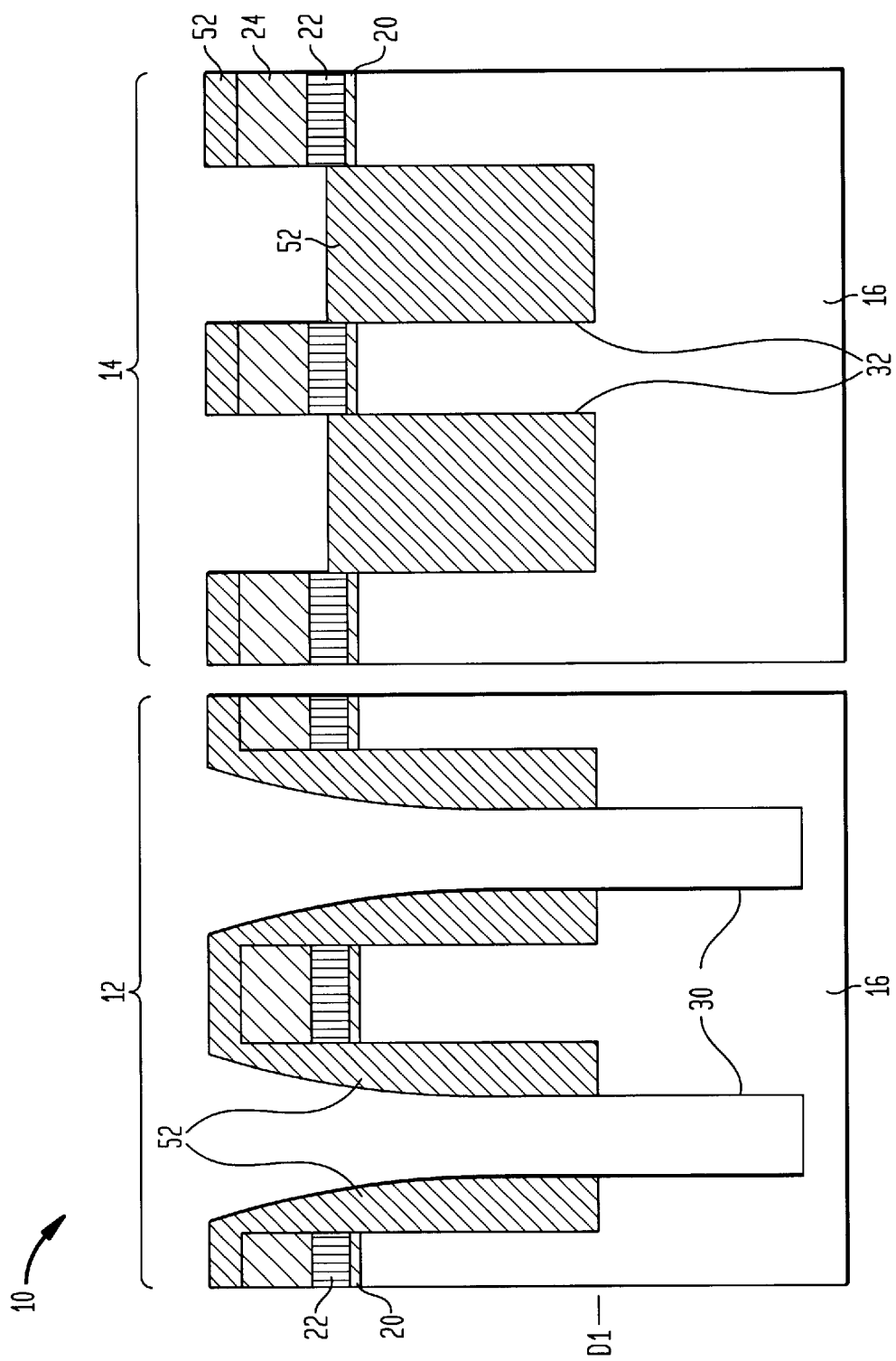
FIG. 7 is a cross-sectional view of the semiconductor device of FIG. 6 after an anisotropic etching step of some of the trenches in accordance with the present invention.

Referring to FIG. 7, isolation trenches 30 are now etched by an anisotropic etching process using masking layer 52 to protect sidewalls of substrate 16 down to D1. Advantageously, the anisotropic etching is performed only in array portion 12 (or wherever the larger trenches, e.g., 30, are located) and extends the depth of trenches 30. Anisotropic etching preferably includes reactive ion etching (RIE).

Figure 8:
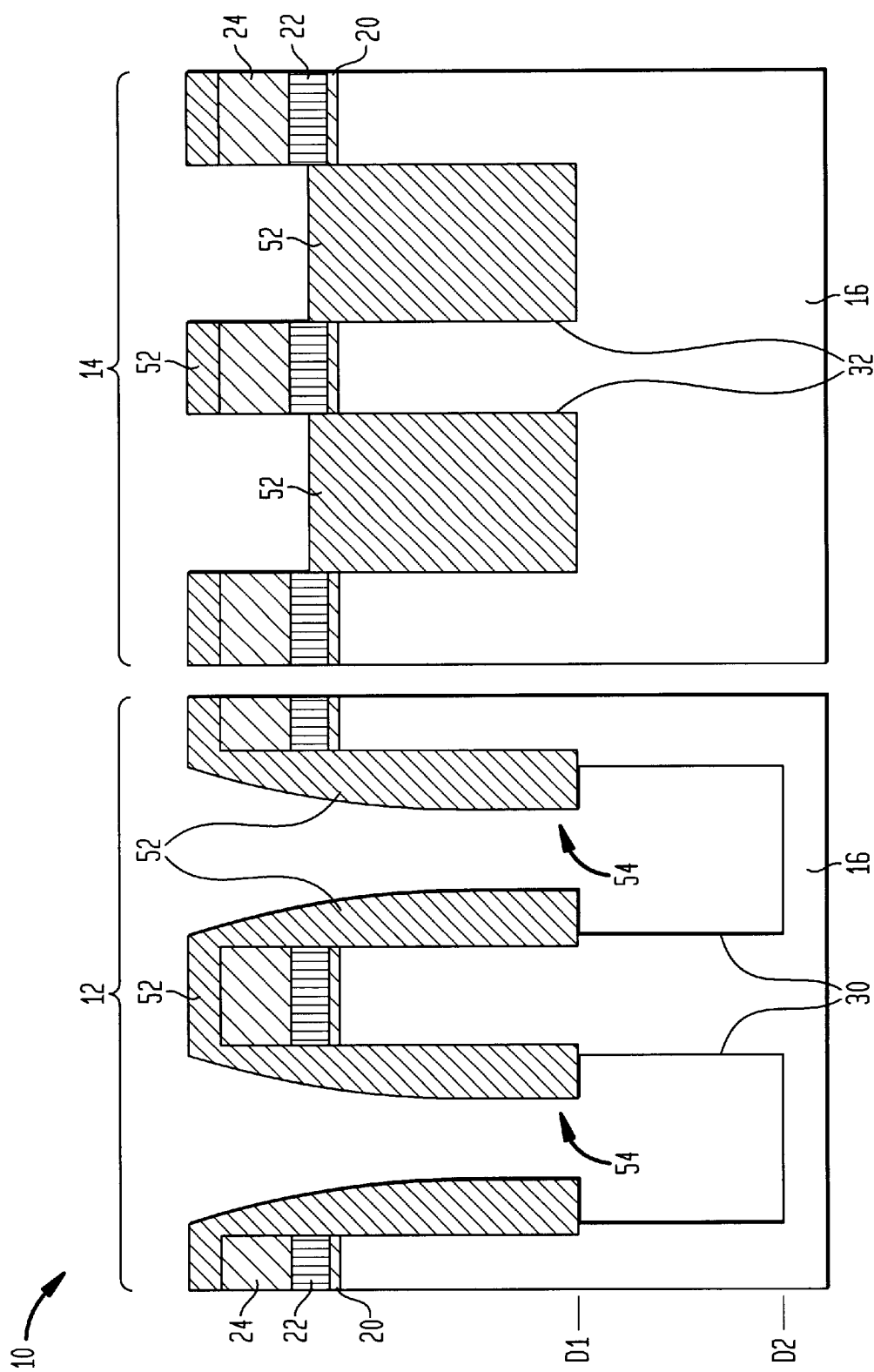
FIG. 8 is a cross-sectional view of the semiconductor device of FIG. 7 after widening and deepening some of the trenches in accordance with the present invention.

Referring to FIG. 8, isotropic etching is now performed to deepen and widen trenches to a second depth D2. Isotropic etching may include wet etching, for example, with HF, Ammonium hydroxide or potassium hydroxide etchants. The depth and width of the trenches is proportional to the size of openings 54 in masking layer 52. Advantageously, the depth will be defined based on the overall size of the trench. This ensures that aspect ratios of trenches 30, 32 and any other trenches are maintained below a predetermined value or threshold. Aspect ratio is the ratio of depth of the trench over the smallest width of the trench. In one embodiment, trenches 30 are increased in depth by between about 50 nm to about 250 nm. Other depth dimensions are also contemplated.

Figure 9:
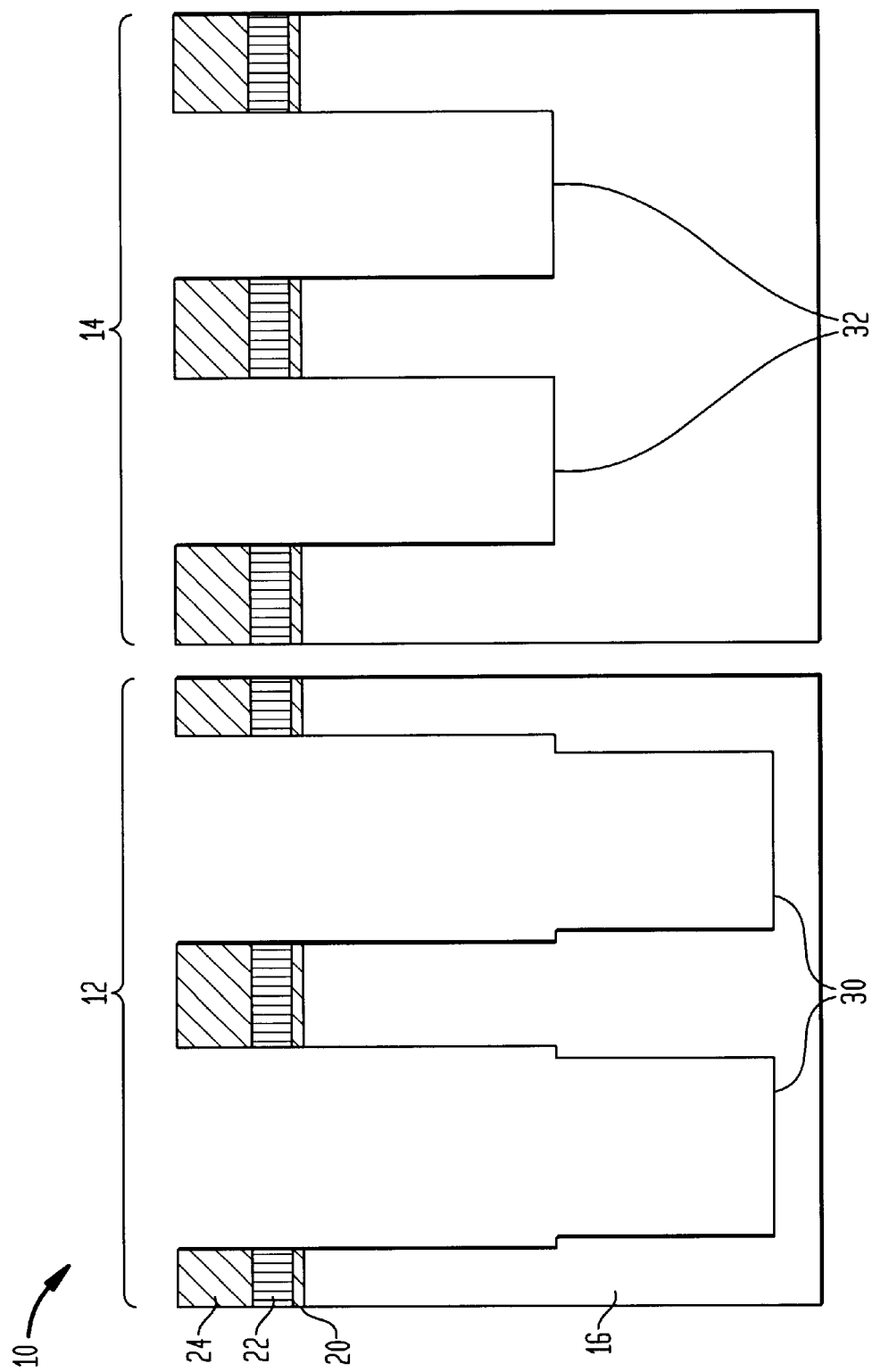
FIG. 9 is a cross-sectional view of the semiconductor device of FIG. 8 after removal of the masking layer in accordance with the present invention.

Referring to FIG. 9, masking layer 52 is now removed from device 10 by an etching process. Masking layer 52 is removed selectively from substrate 16, by known etching processes. Hardmask 24 is also removed, and if formed from a same or similar material as masking layer 52, is removed at the same time as masking layer 52, selective to pad dielectric layer 18 and substrate 16.

As shown in FIG. 9, aspect ratios of trenches 30 and 32 are maintained below a predetermined value, for example, 5 or less. The methods of the present invention ensure that the aspect ratios are maintained below a given value throughout device 10. In this way, a single process recipe can be employed to fill all trenches (30 and 32) simultaneously and ensure good fill characteristics. Further, since the aspect ratios are self-limited by the methods of the present invention gapfill requirements are relaxed even though deeper isolation trenches are provided.

Figure 10:
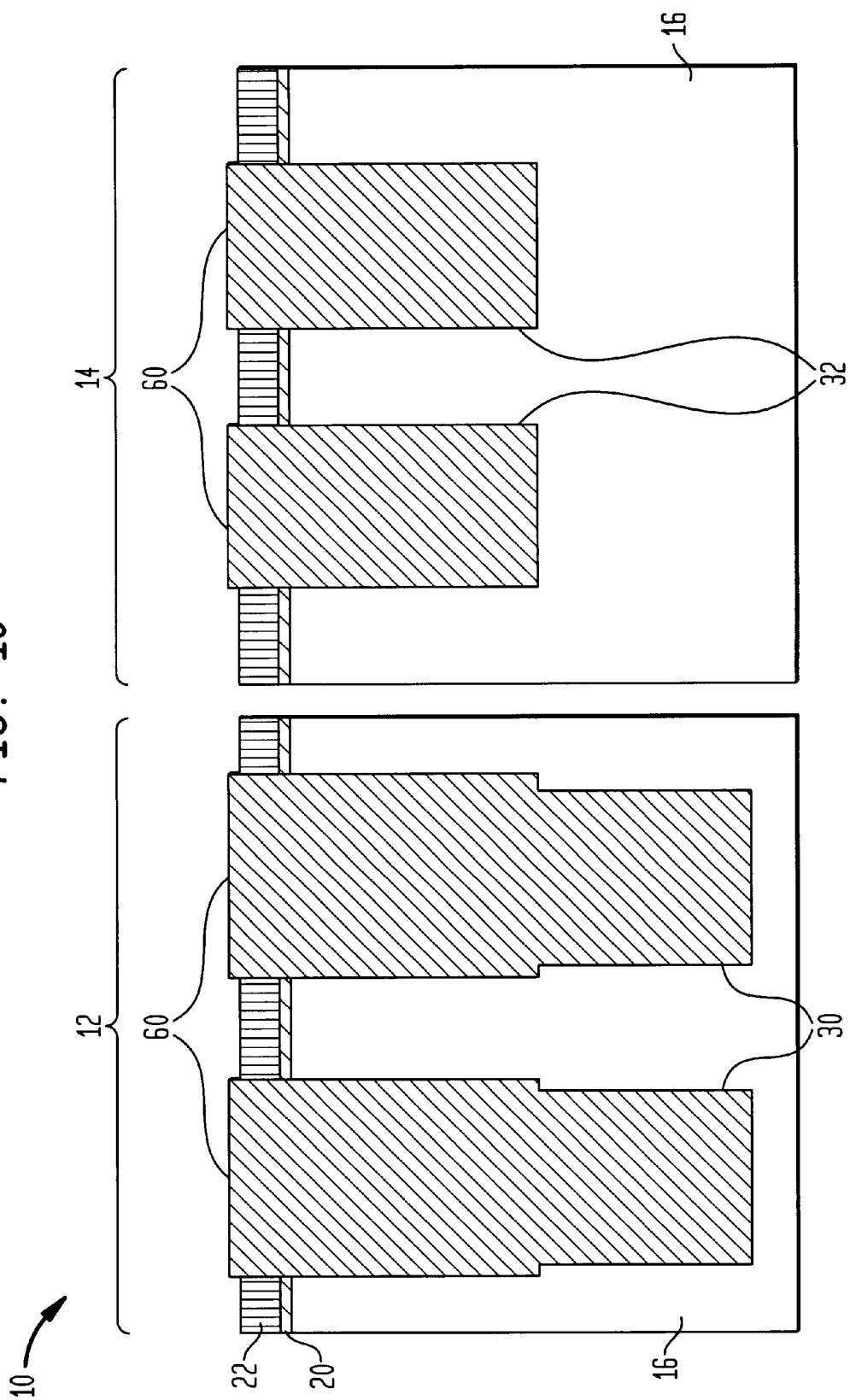
FIG. 10 is a cross-sectional view of the semiconductor device of FIG. 9 after the trenches have been filled and planarized in accordance with the present invention.

Referring to FIG. 10, trenches 30 and 32 are now filled in a single deposition process. Dielectric material 60 is deposited to fill trenches 30 and 32. Dielectric material 60 preferably includes an oxide, such as silicon dioxide. Processing then continues as is known in the art.

It is to be understood that the present invention may be employed on a plurality of different sized trenches. Say, for example, trenches having three or more different sized openings at the mouth of the trench. The present invention may be employed by selecting the size trench which is not to be extended in depth and then choosing a masking layer thickness which will ensure that these trenches become completely filled. Next, etching prepares the larger trenches (greater than the selected size or threshold size) to be deepened. These trenches are then extended to a depth proportional to the size of the trench, which maintains the aspect ratio. The present invention is applicable to any device which includes two or more sized trenches.

It is further contemplated that the present invention may employ a plurality of different depth increase stages to achieve different depths. For example, a first depth is achieved for trenches by etching a substrate. Then, smaller trenches (below a threshold size) are blocked wile larger trenches are lined. The larger trenches are now etched deeper to a second depth. A masking layer may now be deposited again. This time blocking smaller trenches and some of the larger trenches, while lining the largest trenches. Now, the largest trenches may be deepened in accordance with the invention. These steps may be repeated as needed.

Having described preferred embodiments for method for forming and filling isolation trenches (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming isolation trenches in semiconductor devices, comprising the steps of:

forming, in a substrate, a plurality of trenches having different widths including widths above a threshold size and widths below a threshold size, the plurality of trenches having a same first depth wherein the trenches with the widths above the threshold size are formed in a memory array, and the trenches with the widths below the threshold size are formed in a support area;

depositing a masking layer in the plurality of trenches, the masking layer including a thickness sufficient to both line the trenches with the widths above the threshold size and completely fill the trenches with the widths below the threshold size;

exposing a portion of the substrate at a bottom of the trenches with the widths above the threshold size by etching the masking layer over the plurality of trenches; and etching the plurality of trenches to extend the trenches with the widths above the threshold size to a different depth.

2. The method as recited in claim 1, wherein the step of depositing a masking layer includes the step of conformally depositing the masking layer with a low pressure chemical vapor deposition process.

3. The method as recited in claim 1, wherein the masking layer includes TEOS.

4. The method as recited in claim 1, further comprising the step of maintaining an aspect ratio of the different depths below a value for the trenches with the widths above the threshold size.

5. The method as recited in claim 4, further comprising the step of filling the plurality of trenches in a single deposition step.

6. The method as recited in claim 4, wherein the aspect ratio is less than or equal to 5.

7. The method as recited in claim 1, wherein the step of etching the plurality of trenches includes the step of anisotropically etching the trenches to increase the depth of the trenches with the widths above the threshold size.

8. The method as recited in claim 1, wherein the step of etching the plurality of trenches includes the step of isotropically etching the trenches to increase the width of the trenches with the widths above the threshold size.

9. A method for forming isolation trenches in semiconductor devices, comprising the steps of:

forming, in a substrate, first trenches having a first width and second trenches having a second width wherein the first width is larger than the second width and the first and second trenches have a same first depth, and wherein the first trenches are formed in a memory array and the second trenches are formed in a support area;

depositing a masking layer in the first and second trenches, the masking layer including a thickness sufficient to both line the first trenches and completely fill the second trenches;

exposing a portion of the substrate at a bottom of the first trenches by etching the masking layer to form an opening through the masking layer at the first depth; and etching the first and second trenches to extend the first trenches to a second depth.

10. The method as recited in claim 9, wherein the step of depositing a masking layer includes the step of conformally depositing the masking layer with a low pressure chemical vapor deposition process.

11. The method as recited in claim 9, wherein the masking layer includes TEOS.

12. The method as recited in claim 9, wherein the step of etching includes maintaining an aspect ratio of the first trenches below a threshold value.

13. The method as recited in claim 12, wherein the aspect ratio is less than or equal to 5.

14. The method as recited in claim 9, further comprising the step of filling the first and second trenches in a single deposition step.

15. The method as recited in claim 9, wherein the step of etching includes the step of anisotropically etching the trenches to increase the depth of the trenches with the widths above the threshold size.

16. The method as recited in claim 9, wherein the step of etching includes the step of isotropically etching the trenches to increase the width of the trenches with the widths above the threshold size.

17. A method for forming isolation trenches in semiconductor devices, comprising the steps:

providing a semiconductor substrate having a memory array area and a support area formed thereon;

forming, in the semiconductor substrate, first trenches having a first width in the memory array area and second trenches having a second width in the support area, wherein the first width is larger than the second width and the first and second trenches have a same first depth;

depositing a masking layer in the first and second trenches, the masking layer including a thickness sufficient to both line the first trenches and completely fill the second trenches;

exposing a portion of the substrate at a bottom of the first trenches by etching the masking layer to form an opening through the masking layer at the first depth;

etching the first and second trenches to extend the first trenches to a second depth while maintaining an aspect ratio of the first trenches below a threshold value; and filling the first trenches to the second depth and the second trenches to the first depth with a dielectric material in a single deposition step.

18. The method as recited in claim 14, wherein the step of depositing a masking layer includes the step of conformally depositing the masking layer with a low pressure chemical vapor deposition process.

19. The method as recited in claim 17, wherein the masking layer includes TEOS.

20. The method as recited in claim 17, wherein the aspect ratio is less than or equal to 5.

21. The method as recited in claim 17, wherein the step of etching includes the step of anisotropically etching the trenches to increase the depth of the trenches with the widths above the threshold size.

22. The method as recited in claim 17, wherein the step of etching includes the step of isotropically etching the trenches to increase the width of the trenches with the widths above the threshold size.

\* \* \* \* \*